(12) United States Patent
Seo et al.

(10) Patent No.: US 8,242,606 B2
(45) Date of Patent: Aug. 14, 2012

(54) SEMICONDUCTOR INTEGRATED CIRCUIT

(75) Inventors: Ji-Tai Seo, Gyeonggi-do (KR); Yun Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 137 days.

(21) Appl. No.: 12/833,777

(22) Filed: Jul. 9, 2010

(65) Prior Publication Data

US 2011/0260330 A1    Oct. 27, 2011

(30) Foreign Application Priority Data

Apr. 27, 2010  (KR) .................. 10-2010-0038935

(51) Int. Cl.
    *H01L 23/48* (2006.01)
(52) U.S. Cl. ...................................... 257/774
(58) Field of Classification Search .......... 257/42,
    257/774, E23.011, 322, 312, 339, 392, 393,
    257/347, 662, E21.32, 444, 445, 547, 557,
    257/585, 127, 409, 452, 484, 490, 494, 495,
    257/605, E29.012, E29.013, 54, 73, 155–156,
    257/267, 280–284, 449–457, 928, E51.009,
    257/E33.051, E33.065–E33.066, E31.074–E31.075,
    257/E27.04, E27.068, E29.041, E29.148–E29.149,
    257/E29.178, E29.271, E29.311, E29.317,
    257/E21.047, E21.064, E21.163, E21.173,
    257/E21.186–E21.187, E21.351–E21.368,
    257/E21.371, E21.425, E21.45–E21.455,
    257/E21.458, E31.065–E31.066, E29.338
See application file for complete search history.

(56) References Cited

U.S. PATENT DOCUMENTS

| 7,847,339 | B2 * | 12/2010 | Lee et al. ............... 257/322 |
| 2006/0001174 | A1 * | 1/2006 | Matsui ................... 257/774 |
| 2006/0060934 | A1 | 3/2006 | Lien et al. |

FOREIGN PATENT DOCUMENTS

| JP | 2009-088336 | 4/2009 |
| KR | 100826979 | 5/2008 |

OTHER PUBLICATIONS

Cyrille Laviron et al., "Via First Approach Optimisation for Through Silicon Via Applications," Electronic Components and Technology Conference, 2009, pp. 14-19, IEEE.

Notice of Allowance issued by the Korean Intellectual Property Office on Feb. 10, 2012.

Dr. ir G. Van der Plas, "Substrate Noise Coupling in Analog/RF Systems," Jun. 2009, Ultgeverij VUBPRESS Brussels University Press.

* cited by examiner

*Primary Examiner* — Dao H Nguyen
*Assistant Examiner* — Tram H Nguyen
(74) *Attorney, Agent, or Firm* — IP & T Group LLP

(57) ABSTRACT

A semiconductor integrated circuit includes a semiconductor chip. The semiconductor chip includes a well arranged to receive a first well bias voltage from a well biasing region, a through-chip-via arranged to penetrate the well, and a guard region disposed around the through-chip-via with space in-between and arranged to apply a second well bias voltage to the well.

15 Claims, 5 Drawing Sheets

SEMICONDUCTOR INTEGRATED CIRCUIT

CROSS-REFERENCE TO RELATED APPLICATIONS

The present application claims priority of Korean Patent Application No. 10-2010-0038935, filed on Apr. 27, 2010, which is incorporated herein by reference in its entirety.

BACKGROUND OF THE INVENTION

Exemplary embodiments of the present invention relate to semiconductor designing technology, and more particularly, to a semiconductor integrated circuit.

Semiconductor integrated circuit packaging technology continues to advance for meeting demands for smaller chip sizes and packaging reliability. As electrical/electronic devices with improved performance characteristics are miniaturized, diverse stack packaging technologies have been developed.

"Stack" means a pile of two or more chips or packages in a vertical direction in the semiconductor industry. By using a stack package, a semiconductor memory device may achieve a memory capacity twice as much as a memory capacity achieved through a conventional semiconductor integration process. Since the stack packages have benefits in terms of packaging density and packaging area efficiency, the research and development of stack packages are being actively pursued.

Stack packages may be fabricated through a method of stacking individual semiconductor chips and packaging the entire stacked semiconductor chips or a method of stacking packaged individual semiconductor chips. The individual semiconductor chips of a stack package are electrically connected to each other through metal wire or through silicon via (TSV). In particular, a stack package using a through silicon via has a structure where a through silicon via is formed internally within semiconductor chips and the semiconductor chips are physically and electrically connected in a vertical direction by the through silicon via.

FIG. 1A is a plan view illustrating a semiconductor integrated circuit according to a first embodiment of a prior art. FIG. 1B is a side cross-sectional view of the semiconductor integrated circuit of FIG. 1A along a line A-A'. FIG. 2A is a plan view illustrating a semiconductor integrated circuit according to a second embodiment of a prior art. FIG. 2B is a side cross-sectional view of the semiconductor integrated circuit of FIG. 1A along a line B-B'.

Referring to FIGS. 1A to 2B, an example where there is one semiconductor chip and one through silicon via penetrating the semiconductor chip vertically will be described for illustration purposes.

Referring to FIGS. 1A and 1B, a semiconductor chip 10 includes a through silicon via 12 penetrating the semiconductor chip in a vertical direction. The semiconductor chip 10 is generally a silicon substrate into which a P-type impurity such as boron (B) is ion-implanted, where the implanted substrate is used as a P-well. Although not illustrated in the drawings, a well-biasing region may be formed to apply a well bias of a low voltage VSS to the semiconductor chip 10. The through silicon via 12 is formed of a metal having a great conductivity. For example, the through silicon via 12 may be formed of copper (Cu).

Referring to FIGS. 2A and 2B, a semiconductor chip 20 is used as a P-well, and the semiconductor chip 20 includes a through silicon via 22 penetrating, for example, completely, through the semiconductor chip 20 in a vertical direction, and an N-well 24 includes the through silicon via 22. Herein, the semiconductor chip 20 may be a silicon substrate into which a P-type impurity, such as boron (B), is ion-implanted. As for the through silicon via 22, a metal having a great conductivity such as copper (Cu) may be used. Also, the N-well 24 is a region formed of an N-type impurity as opposed to the P-type impurity of the substrate. Meanwhile, although not illustrated in the drawings, the semiconductor chip 20 includes a well biasing region for applying a well bias of a low voltage VSS, and the N-well 24 includes a well biasing region for applying a well bias of a high voltage VDD as well.

At least two or more semiconductor chips 10 or 20 may be stacked, where they interface signals and power source with each other through the through silicon vias 12 or 22, respectively.

The above-described semiconductor integrated circuit, however, raises the following concerns.

Referring back to FIGS. 1A and 1B, a metal-semiconductor junction is formed between the semiconductor chip 10 and the through silicon via 12. As a result, a parasitic diode called Schottky barrier diode is formed between the semiconductor chip 10 and the through silicon via 12. Therefore, a backward bias is designed to be normally applied across the Schottky barrier diode between the semiconductor chip 10 and the through silicon via 12. In short, although the ground voltage VSS, which is the lowest voltage, flows to the through silicon via 12, a forward bias across the Schottky barrier diode may be prevented by applying a well bias of a ground voltage VSS to the semiconductor chip 10. Here, since the through silicon via 12 is formed in the semiconductor chip 10, the total area of the semiconductor chip 10 decreases, and the resistance of the semiconductor chip 10 increases. This is because when the semiconductor chip 10 operates as a resistor, its resistance is in reverse proportion to a cross sectional area of the semiconductor chip 10. When the resistance of the semiconductor chip 10 is increased, the bias voltage in being applied across the semiconductor chip 10 tends to be subjected to an increase.

Likewise, in case of FIGS. 2A and 2B, although the power source voltage VDD, which is the highest voltage, is applied at the through silicon via 22, a forward bias across the Schottky barrier diode may be prevented by applying a well bias of the power source voltage VDD to the N-well 24. However, since the through silicon via 22 is formed to penetrate the N-well 24, for example, completely, the resistance of the N-well 24 becomes greater as described above. As a result, the bias voltage level applied through the N-well 24 may decrease.

As a result, a forward bias across the respective Schottky barrier diodes formed between the semiconductor chip 10 and the through silicon via 12 and formed between the N-well 24 and the through silicon via 22 may develop and form a current path. Even when an amount of current flowing through the current path is minute, power is still being wasted, signal transmission speeds decrease, and noise in signals increase. When excessively great current flows through the current path, a latch up phenomenon may occur and cause a failure in the semiconductor chips 10 or 20.

To address the above-described concerns with the conventional technology, when the through silicon via 12 and 22 are formed in the semiconductor chip 10 or 20 through the N-well 24, an insulation layer may be formed with more than a predetermined thickness, or an ion-implantation may be performed. In performing these steps, however, the total number of procedural steps increases and, the production time and production cost for fabricating a semiconductor integrated circuit increase.

SUMMARY OF THE INVENTION

An embodiment of the present invention is directed to a semiconductor integrated circuit that may prevent a current path from being formed in a metal-semiconductor junction as well as reducing production time and production cost for fabricating a semiconductor integrated circuit.

In accordance with an embodiment of the present invention, a semiconductor integrated circuit includes a semiconductor chip that includes a well arranged to receive a first well bias voltage from a well biasing region, a through-chip-via arranged to penetrate the well, and a guard region disposed around the through-chip-via with space in-between and arranged to apply a second well bias voltage to the well.

In accordance with another embodiment of the present invention, a semiconductor integrated circuit includes a plurality of semiconductor chips, wherein each of the semiconductor chips includes a well arranged to receive a first well bias voltage from a well biasing region, a through-chip-via arranged to penetrate the well and operate as an interface for signals between the plurality of semiconductor chips, and a guard region disposed around the through-chip-via with space in-between and arranged to apply a second well bias voltage to the well.

In accordance with yet another embodiment of the present invention, a method includes receiving a first well bias voltage from a well biasing region to bias a well of a semiconductor chip having a through-chip via and receiving a second well bias voltage at a guard region of the well to maintain a diode junction formed between the well and the through-chip via backward-biased, the second well bias voltage being applied to compensate for a reduction in the first well bias voltage due to a resistance of the well.

DESCRIPTION OF SPECIFIC EMBODIMENTS

Figure 1A:
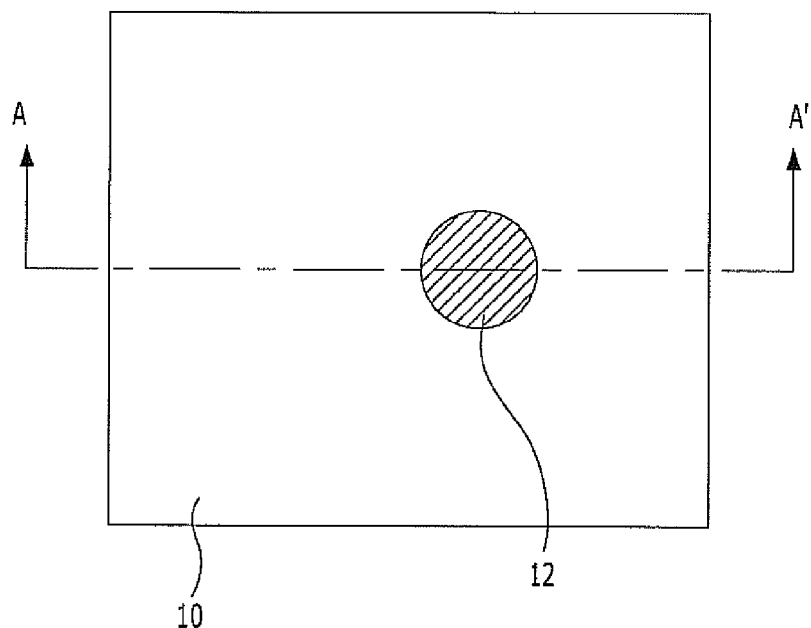
FIG. 1A is a plan view illustrating a semiconductor integrated circuit according to a first embodiment of a prior art.
Figure 1B:
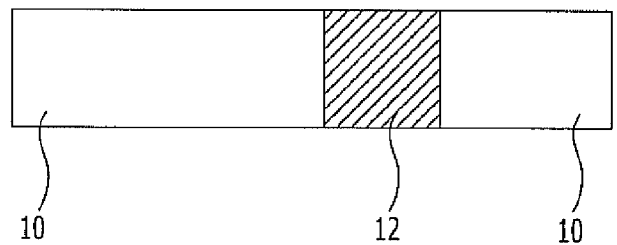
FIG. 1B is a side cross-sectional view of the semiconductor integrated circuit of FIG. 1A along a line A-A'.
Figure 2A:
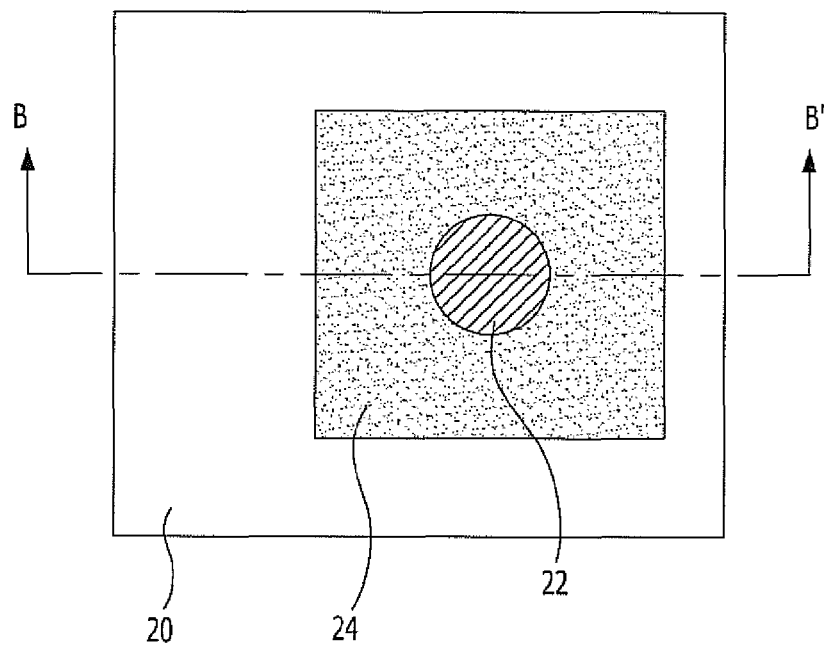
FIG. 2A is a plan view illustrating a semiconductor integrated circuit according to a second embodiment of a prior art.
Figure 2B:
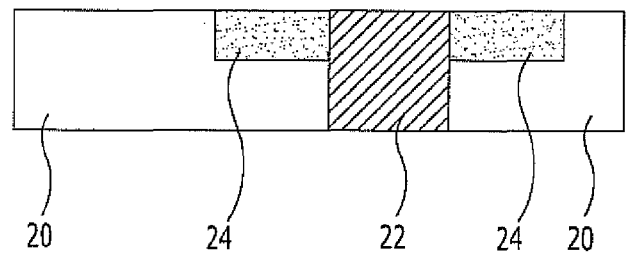
FIG. 2B is a side cross-sectional view of the semiconductor integrated circuit of FIG. 1A along a line B-B'.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In an exemplary embodiment of the present invention, a semiconductor chip among a plurality of semiconductor chips stacked to form a semiconductor integrated circuit is described as an example.

Figure 3A:
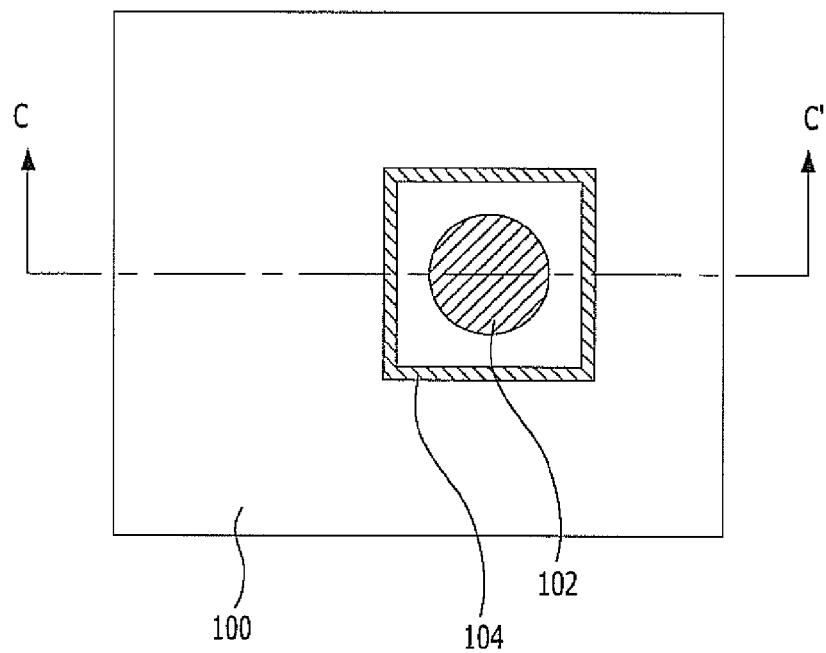
FIG. 3A is a plan view illustrating a semiconductor integrated circuit in accordance with a first embodiment of the present invention.
Figure 3B:
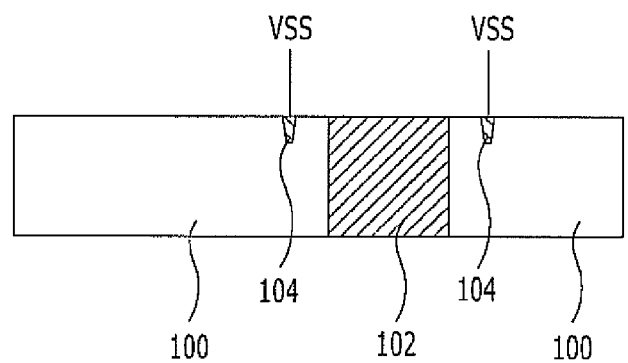
FIG. 3B is a side cross-sectional view of the semiconductor integrated circuit of FIG. 3A along a line C-C'.
Figure 4:
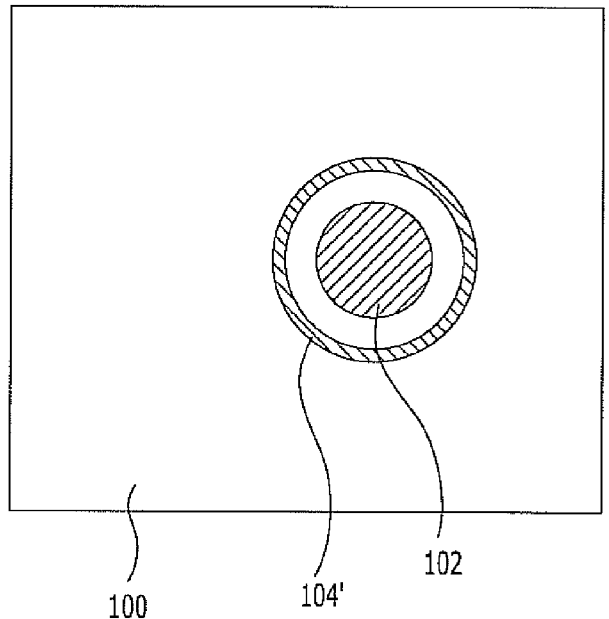
FIG. 4 is a plan view illustrating the semiconductor integrated circuit of FIG. 3A having another shape of a guard region.
Figure 5:
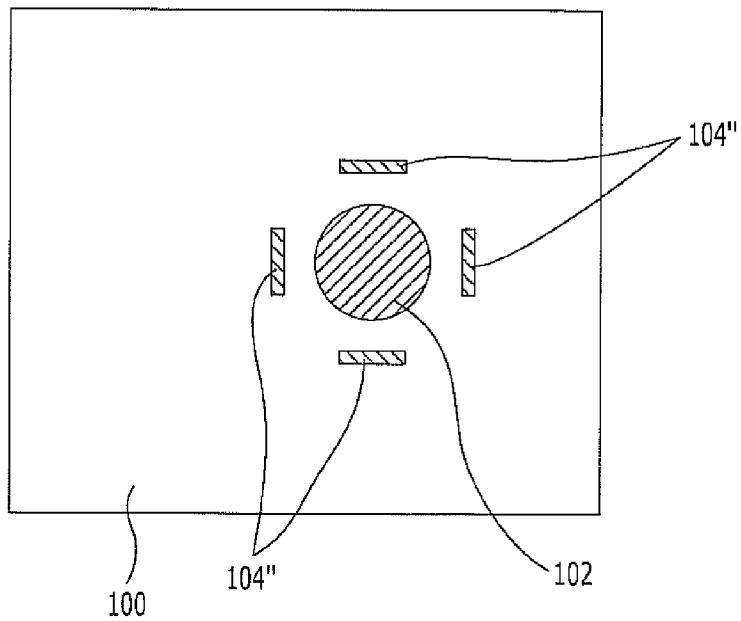
FIG. 5 is a plan view illustrating the semiconductor integrated circuit of FIG. 3A having yet another shape of a guard region.

FIG. 3A is a plan view illustrating a semiconductor integrated circuit in accordance with a first embodiment of the present invention. FIG. 3B is a side cross-sectional view of the semiconductor integrated circuit of FIG. 3A along a line C—C'. FIG. 4 is a plan view illustrating the semiconductor integrated circuit of FIG. 3A having a guard region with another shape. FIG. 5 is a plan view illustrating the semiconductor integrated circuit of FIG. 3A having a guard region with yet another shape.

Referring to FIGS. 3A and 3B, the semiconductor integrated circuit includes a semiconductor chip 100, a through silicon via (TSV) 102 penetrating the inside of the semiconductor chip 100 in a vertical direction, and a guard region 104 disposed around the through silicon via 102 which is spaced apart from the through silicon via 102 and applies a predetermined bias to the semiconductor chip 100.

The semiconductor chip 100 may be any reasonably suitable silicon substrate into which a P-type impurity such as boron (B) is ion-implanted, where the semiconductor chip 100 is used as a P-well. Hereafter, the semiconductor chip 100 is referred to as a P-well.

The through silicon via 102 serves as an interface between the stacked semiconductor chips (not shown) for sharing signals and power. The through silicon via 102 is formed of a metal having a great conductivity, such as copper (Cu).

The guard region 104 is arranged in a polygonal shape surrounding the regions around the through silicon via 102 and the guard region 104 is doped with the same impurity as the P-well 100. Here, the P-well 100 and the guard region 104 may be doped with different impurity concentrations. To be specific, the P-well 100 is doped with a low-concentration P-type impurity (P−), and the guard region 104 is doped with a high-concentration P-type impurity (P+). Therefore, since both the P-well 100 and guard region 104 are doped with the same material, the P-well 100 and the guard region 104, are short-circuited so that, when a well voltage, for example, a ground voltage VSS, is applied through the guard region 104, a strong bias of the ground voltage VSS is applied to the P-well 100 around the through silicon via 102. Here, the guard region 104 may be provided in any reasonably suitable shape including but not limited to the above described polygonal shape, a ring shape surrounding the through silicon via 102, as illustrated in FIG. 4, a non-contiguous shape such as an island shape surrounding the through silicon via 102 illustrated in FIG. 5, etc.

Although not illustrated in the drawings, a well biasing region is further formed to apply a well bias of the ground voltage VSS to the P-well 100. The well biasing region is a body biasing region for applying a body bias to a MOS transistor mounted on the semiconductor chip 100 including the through silicon via 102. For example, a well biasing region may be any reasonably suitable portion of the P-well 100 other than the guard region 206.

The semiconductor integrated circuit having the above structure tends to have an increased resistance for the P-well 100 because the through silicon via 102 is formed inside the semiconductor chip 100 and thus reduce the cross section area of the P-well 100. As a result, the voltage level of the well bias (VSS) as applied to the P-well 100 tends to increase due to the increased resistance. However, according to the first embodiment of the present invention, a ground voltage VSS is applied, through the guard region 104, to the through silicon via 102 and thus a backward bias is maintained in the parasitic diode formed at the junction between the P-well 100 and the through silicon via 102 (the diode is referred to as a Schottky barrier diode) and the formation of a current path through the Schottky barrier diode is prevented from the onset.

Figure 6A:
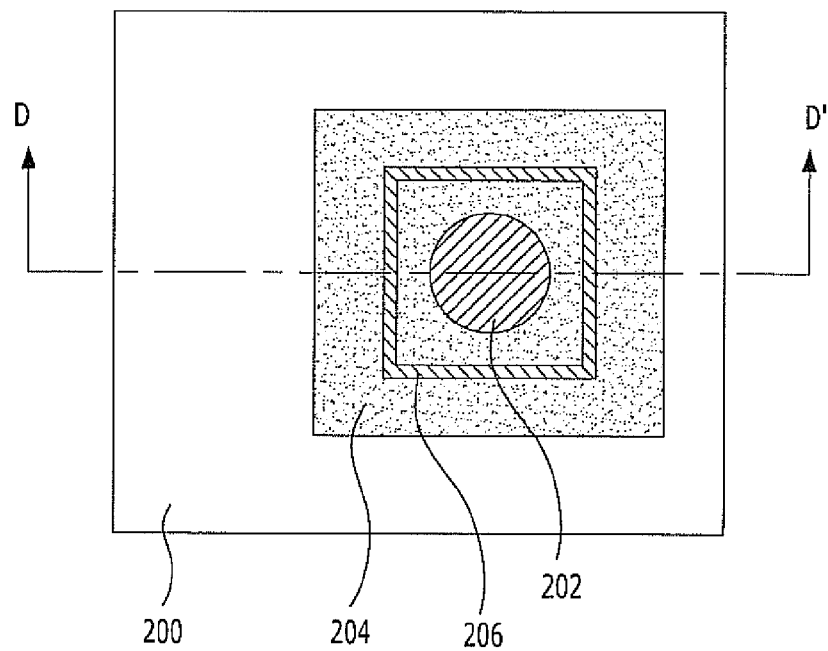
FIG. 6A is a plan view illustrating a semiconductor integrated circuit in accordance with a second embodiment of the present invention.
Figure 6B:
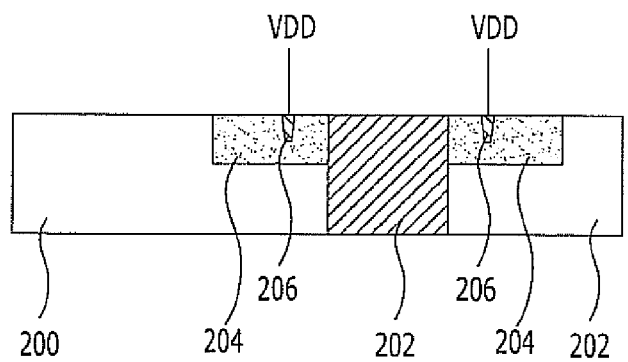
FIG. 6B is a side cross-sectional view of the semiconductor integrated circuit of FIG. 6A along a line D-D'.

FIG. 6A is a plan view illustrating a semiconductor integrated circuit in accordance with a second embodiment of the present invention. FIG. 6B is a side cross-sectional view of the semiconductor integrated circuit of FIG. 6A along a line D-D'.

In the second embodiment of the present invention, a well formed of an impurity different from the material forming a semiconductor chip is formed on the surface of the semiconductor chip and a through silicon via is formed to penetrate the well.

Referring to FIGS. 6A and 6B, the semiconductor integrated circuit includes a semiconductor chip 200, a through silicon via 202 penetrating the semiconductor chip 200, a well 204 enclosing the through silicon via 202 on the surface, and a guard region 206 disposed on the surface of the well 204 and spaced apart from the through silicon via 202 and to apply a bias to the well 204.

The semiconductor chip 200 may be a silicon substrate into which a P-type impurity such as boron (B) is ion-implanted, where the semiconductor chip 200 is used as a P-well. Hereafter, the semiconductor chip 200 is referred to as a P-well.

The through silicon via 202 may operate as an interface between stacked semiconductor chips (not shown) for sharing signals and power, and the through silicon via 202 is formed of a metal having a great conductivity, such as copper (Cu).

The well 204 is an N-type well formed of an impurity different from the impurity of the P-well 100. Hereafter, the well 204 is referred to as an N-well.

The guard region 206 may be arranged in a polygonal or any other reasonably suitable shape surrounding the through silicon via 202, and the guard region 206 is formed by being doped with the same impurity as that of the N-well 204. Herein, the N-well 204 and the guard region 206 may be doped with different impurity concentrations. To be specific, the N-well 204 may be doped with a low-concentration N-type impurity (N−), while the guard region 206 is doped with a high-concentration N-type impurity (N+). Therefore, since the N-well 204 and the guard region 206 are doped with the same material, the N-well 204 and the guard region 206 are short-circuited, so that when a well bias, for example, a power source voltage VDD, is applied through the guard region 206, a strong bias of the power source voltage VDD is applied to the N-well 204 around the through silicon via 202. Although the guard region 206 is described above to be arranged in the polygonal shape, the guard region 206 may be arranged in any other reasonably suitable shape including a ring shape surrounding the through silicon via 202 or a non-continuous shape such as the shape of a plurality of islands (see FIGS. 4 and 5).

Although not illustrated in the drawings, the semiconductor integrated circuit may further include a first well biasing region for applying a well bias of a ground voltage VSS to the P-well 200, and a second well biasing region for applying a well bias of the power source voltage VDD to the N-well 204 enclosing the through silicon via 202. For example, a well biasing region may be any reasonably suitable portion of the N-well 204 other than the guard region 206.

The semiconductor integrated circuit including the above tends to have an increased resistance of the N-well 204 because the through silicon via 202 is formed inside the N-well 204. As a result, the voltage VDD of the well bias applied to the N-well 204 tends to decrease in biasing the parasitic diode between the N-well 204 and the through silicon via 202. However, according to the second embodiment of the present invention, a power source voltage VDD is supplied to through the guard region 206 to the N-well 204, where the N-well 204 is coupled to the through silicon via 202. Thus, a backward bias may be maintained across the parasitic diode formed at the junction between the N-well 204 and the through silicon via 202, which diode is referred to as a Schottky barrier diode, and the formation of a current path through the Schottky barrier diode is prevented from the onset.

According to the first and second embodiments of the present invention, since a current path may be prevented from being formed at a metal-semiconductor junction from the onset, t the failure of the semiconductor integrated circuit may be minimized.

According to an exemplary embodiment of the present invention, a formation of a current path at a metal-semiconductor junction may be prevented by additionally forming a guard region for applying a desired voltage level to the metal-semiconductor junction, where a through silicon via is also formed.

According to an exemplary embodiment of the present invention, production time and production cost can be reduced because formation of an insulation layer in the metal-semiconductor junction or additional implantation is not required.

Therefore, according to an exemplary embodiment of the present invention, the operation reliability and stability of a semiconductor integrated circuit may be improved while maintaining competitive benefits of the product.

While the present invention has been described with respect to the specific embodiments, it will be apparent to those skilled in the art that various changes and modifications may be made without departing from the spirit and scope of the invention as defined in the following claims.

Although the present invention has been described in terms of a semiconductor chip formed of a P-well, the same description applies to a semiconductor chip formed of an N-well and a semiconductor chip including a P-well on the surface of the N-well except that the doping types of the elements thereof and the applied voltages reverse.

What is claimed is:

1. A semiconductor integrated circuit, comprising:
   a semiconductor chip that includes
   a well arranged to receive a first well bias voltage from a well biasing region;
   a through-chip-via arranged to penetrate the well; and
   a guard region disposed around the through-chip-via with space in-between and arranged to apply a second well bias voltage to the well.

2. The semiconductor integrated circuit of claim 1, wherein the first well bias and the second well bias have a same voltage level.

3. The semiconductor integrated circuit of claim 1, wherein the guard region is doped with an impurity of the same conductive type as the well.

4. The semiconductor integrated circuit of claim 1, wherein the guard region completely surrounds the through-chip-via.

5. The semiconductor integrated circuit of claim 4, wherein the guard region is disposed in a ring shape surrounding the through-chip-via.

6. The semiconductor integrated circuit of claim 4, wherein the guard region is disposed in a polygonal shape surrounding the through-chip-via.

7. The semiconductor integrated circuit of claim 1, wherein the guard region is disposed in a non-contiguous shape surrounding the through silicon via.

8. The semiconductor integrated circuit of claim 1, wherein the well is a P-well and the second well bias voltage is a ground voltage.

9. The semiconductor integrated circuit of claim 1, wherein the well is doped with a low-concentration P-type impurity, and the guard region is doped with a high-concentration P-type impurity.

10. The semiconductor integrated circuit of claim 3, wherein the well is an N-well and the second well bias voltage is a power source voltage.

11. The semiconductor integrated circuit of claim 1, wherein the well is doped with a low-concentration N-type impurity and the guard region is doped with a high-concentration N-type impurity.

12. The semiconductor integrated circuit of claim 1, wherein the through-chip-via is a through silicon via (TSV).

13. The semiconductor integrated circuit of claim 1, wherein the well is a well formed on a surface of the semiconductor chip and the well is doped with an impurity of a different conductive type than the semiconductor chip.

14. A semiconductor integrated circuit, comprising:
a plurality of semiconductor chips, wherein each of the semiconductor chips includes
a well arranged to receive a first well bias voltage from a well biasing region;
a through-chip-via arranged to penetrate the well and operate as an interface for signals between the plurality of semiconductor chips; and
a guard region disposed around the through-chip-via with space in-between and arranged to apply a second well bias voltage to the well.

15. The semiconductor integrated circuit of claim 14, wherein the well is doped with a low-concentration of an impurity and the guard region is doped with a high-concentration of the impurity.

* * * * *